United States Patent [19]

Bush

[11] Patent Number: 5,719,792
[45] Date of Patent: Feb. 17, 1998

[54] ISOLATOR

[75] Inventor: Terry W. Bush, Greenwood, Ind.

[73] Assignee: Trilithic, Inc., Indianapolis, Ind.

[21] Appl. No.: 544,155

[22] Filed: Oct. 17, 1995

[51] Int. Cl.$^6$ .............................. H03H 7/46; H03H 7/48; H04B 1/50
[52] U.S. Cl. ............ 364/574; 340/825.06; 327/552; 327/555; 333/124; 333/262; 455/3.1; 455/334
[58] Field of Search .............................. 364/148, 550, 364/572, 574; 340/825, 825.01, 825.03, 825.06, 825.07, 825.1; 327/551, 552, 553, 555; 333/100, 117, 124, 126, 262; 455/3.1, 4.1, 4.2, 334, 335

[56] References Cited

U.S. PATENT DOCUMENTS

| | | |
|---|---|---|
| 3,750,022 | 7/1973 | Curry et al. . |
| 3,924,187 | 12/1975 | Dormans . |
| 4,290,142 | 9/1981 | Schnee et al. . |
| 4,381,522 | 4/1983 | Lambert . |
| 4,397,037 | 8/1983 | Theriault .............................. 455/188.2 |
| 4,408,345 | 10/1983 | Yashiro et al. . |
| 4,506,387 | 3/1985 | Walter . |
| 4,710,955 | 12/1987 | Kauffman . |
| 4,755,776 | 7/1988 | Preschutti .............................. 333/100 |
| 4,823,386 | 4/1989 | Dumbauld et al. . |
| 4,890,320 | 12/1989 | Monslow et al. . |
| 4,920,533 | 4/1990 | Dufresne et al. . |
| 4,982,440 | 1/1991 | Dufresne et al. . |
| 5,084,903 | 1/1992 | Mc Namara et al. .................... 370/204 |
| 5,088,111 | 2/1992 | Mc Namara et al. .................... 375/269 |
| 5,093,718 | 3/1992 | Hoarty et al. . |
| 5,126,840 | 6/1992 | Dufresne et al. . |
| 5,208,665 | 5/1993 | McCalley et al. . |
| 5,251,324 | 10/1993 | McMullan, Jr. . |
| 5,255,086 | 10/1993 | McMullan, Jr. et al. . |
| 5,319,455 | 6/1994 | Hoarty et al. . |
| 5,383,112 | 1/1995 | Clark . |
| 5,387,927 | 2/1995 | Look et al. . |
| 5,421,031 | 5/1995 | De Bey . |

OTHER PUBLICATIONS

Communications Engineering & Design Magazine, Roger Brown, "In Perspective", Aug. 1995, p. 5.

*Primary Examiner*—Emanuel T. Voeltz
*Assistant Examiner*—Edward J. Pipala
*Attorney, Agent, or Firm*—Barnes & Thornburg

[57] ABSTRACT

An information system comprises an information network and a station apparatus capable of receiving information from the network and sending a command to the network. An isolator comprises a first diplex filter having an input/output (I/O) port coupled to the network for passing signals with frequencies in first and second non-overlapping ranges. An output port is provided for signals with frequencies in the first range, and an input port is provided for signals with frequencies in the second range. A second diplex filter has an I/O port coupled to the station apparatus for passing signals with frequencies in both the first and second ranges. An input port is provided for signals with frequencies in the first range, and an output port is provided for signals with frequencies in the second range. A first circuit having a bandwidth including the first range provides a first signal path between the output port of the first diplex filter and the input port of the second diplex filter. A second circuit having a bandwidth including the second range provides a second signal path between the output port of the second diplex filter and the input port of the first diplex filter. The second signal path includes a switch. A third circuit senses a signal in the second range. The third circuit is coupled to a control port of the first switch for operating the first switch in response to the sensed signal in the second range from the second diplexer I/O port to open the signal path from the second diplexer I/O port to the first diplexer I/O port.

26 Claims, 7 Drawing Sheets

ISOLATOR

This invention relates to interactive cable television systems in which information or the like is distributed onto the system, and terminal apparatus is queried concerning whether a viewer wishes access to a particular program, for example.

A number of interactive cable systems have been proposed. These are, for example, the systems described in U.S. Pat. Nos. 4,290,142; 4,381,522; 4,408,345; 4,506,387; 4,710,955; 4,823,386; 4,890,320; 5,093,718; 5,319,455; 5,387,927; and 5,421,031. There is also the inventory management system described in U.S. Pat. No. 5,383,112.

A difficulty encountered with the current technology is that, while the cable system down to the customer tap is a very high quality, low noise circuit, the circuit on the customer side of the tap is a relatively much poorer quality circuit which suffers from low noise immunity. In this regard, the circuit on the customer side of the tap can be thought of as an antenna which receives noise from any of the typical, numerous household sources such as refrigerators, air conditioners, blenders, mixers, hair dryers and so on, as well as some slightly more exotic sources, such as amateur radios and the like. For the outbound, or downstream, signal from the cable operator head end to the customer, this is not ordinarily a problem because of the high quality of the circuit to the customer tap, the bandwidth of the outbound signal and related considerations. However, in interactive systems inbound, or upstream, signals from the customer to the head end are also contemplated. The customer's signal is transmitted to the tap via a circuit which is basically an antenna for noise in the customer's signal bandwidth, and is transmitted from the customer's home which is a tremendous and basically uncontrolled source of noise in that bandwidth.

The invention may best be understood by referring to the following description and accompanying drawings which illustrate the invention. In the drawings.

Figure 1:
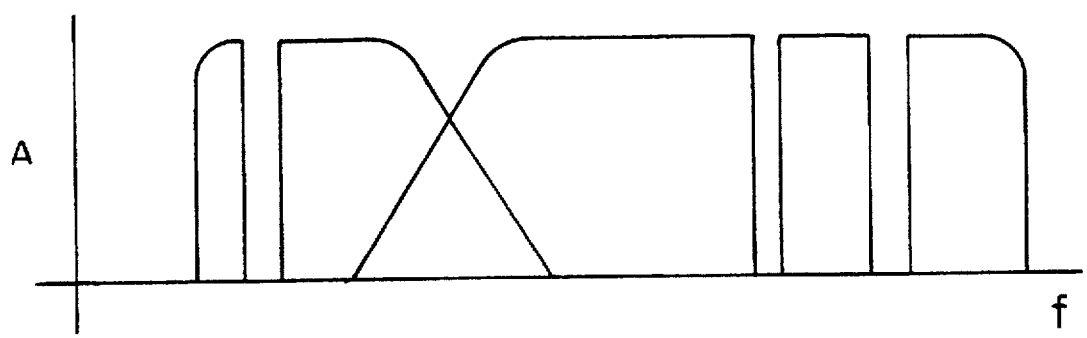
FIG. 1 illustrates a difficulty the invention is intended to address.

Referring now to FIG. 1, a frequency spectrum illustrates, among other spectra, the spectrum of the outbound signal from a cable system head end to subscribers and a possible location of the spectrum of the inbound signals from subscribers to the head end. Generally, the potential bandwidth of the inbound signals to the head end is in the 5 MHz–42 MHz or so range and the bandwidth of the outbound signals from the head end to the subscribers is in the 50 MHz–750 MHz or so range, with certain bands in both the outbound and inbound ranges being excluded. Those excluded bands are reserved for other services, such as telephone. The architecture of a typical cable system, viewed from the head end can be characterized as tree architecture. However, and this is of particular concern in interactive systems, when viewed from the subscriber's station apparatus, the architecture resembles a funnel with all signals from all remote sources (subscribers) being funnelled back to the head end for detection by the head end circuitry. If each subscriber's circuit on the subscriber side of each cable tap can be thought of as a broadband antenna which receives noise from all of the various noise sources around a typical subscriber's home such as refrigerators, blenders, hair dryers, air conditioners, and so on, it will be appreciated that the cable operator side of the subscriber's tap is vulnerable to all kinds of noise from each subscriber's side of the tap. As all of the noise from all of these sources is funnelled back toward the head end, it becomes more and more difficult for the head end to recover intelligence from the inbound signal going upstream toward the head end.

The systems of FIGS. 2–6 address this problem. The systems of FIGS. 2–6 are placed on the subscriber side of each individual subscriber's tap immediately downstream toward the subscriber's station apparatus from the subscriber's tap. In this manner, the amount of relatively lower quality subscriber circuit to which the relatively higher quality cable system circuit upstream of the tap is exposed can be kept to a minimum. When the head end seeks information from a subscriber's station apparatus, it polls that subscriber's station apparatus with a uniquely addressed query. That uniquely addressed query opens the upstream bound channel between that subscriber's station apparatus and the head end. Thus, when that subscriber's station apparatus has not been addressed by a query, the cable system upstream from that subscriber's tap is isolated from that subscriber's station apparatus and all other circuitry on the relatively lower quality circuit side of that subscriber's tap. This in effect isolates the head end from all but a single subscriber circuit noise source at a time. This makes the head end's task of detecting intelligence, such as requests for specific programming by the station apparatus, much more possible to accomplish without error.

Figure 2:
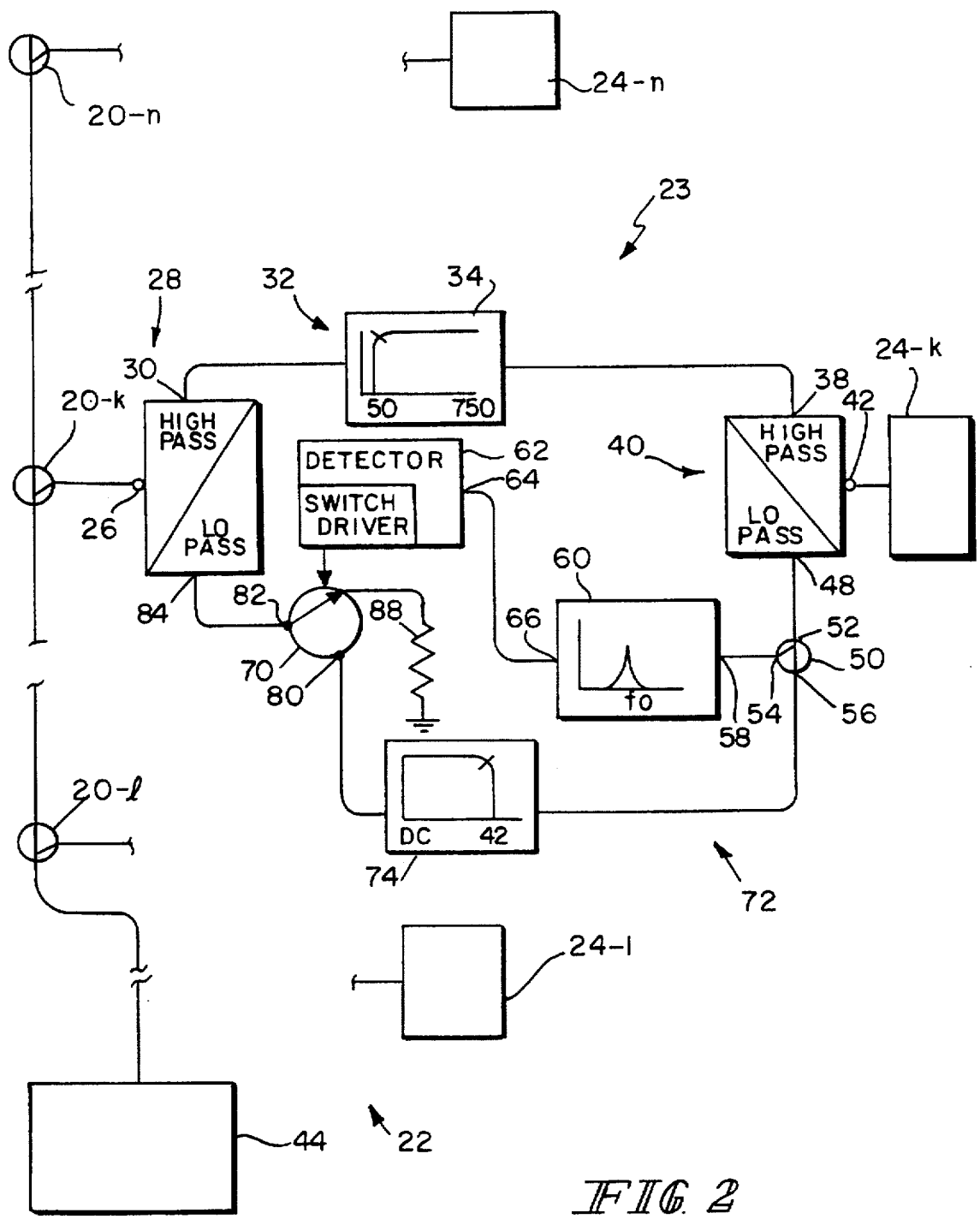
FIGS. 2–7 illustrate partly block and partly schematic diagrams of circuits incorporating the invention.

With particular reference to FIG. 2, the tap 20-k from the cable network 22 is coupled through an isolator 23 to a subscriber's station apparatus 24-k. Isolator 23 includes an input/output (I/O) port 26 of a diplex filter 28, such as, for example, the Eagle, Inc., EDPF 42/54. The high pass output port 30 of filter 28 is coupled through a circuit 32 having frequency response characteristic 34 to ensure the separation illustrated in FIG. 1. Circuit 32 is coupled to a high frequency input port 38 of a second diplex filter 40. The I/O port 42 of filter 40 is coupled to the subscriber's station apparatus 24-k. This is the path which programming, for example, takes from the tap 20-k to the subscriber's station apparatus 24-k for viewing by the subscriber.

Apparatus at the head end 44 of the cable network 22 addresses, for example, by time division multiplexing, queries to the various station apparatus 24-1, 24-2, . . . 24-k . . . 24-n (k and n integers, $1 \leq k \leq n$ coupled to the network 22. Using time division multiplexing, the various station apparatuses 24-1, 24-2, . . . 24-k, . . . 24-n are addressed sequentially by the head end 44. These queries seek commands from the station apparatus, in this example, 24-k, being addressed concerning, for example, cable network programming desired to be accessed by that station apparatus. Such commands, when they are present, enter the cable network 22 one subscriber 24-k at a time and only from the subscriber 24-k to whom the query was addressed. The command opens the return channel upstream to the cable network 22. The command, which is in the low frequency band illustrated in FIG. 1, passes to the low pass output port 48 of diplex filter 40. This output port 48 is coupled to a tap 50 permitting signal flow into its port 52 and from its ports 54 and 56. Tap 50 illustratively is a TVC DC-6 directional coupler. Port 54 is coupled to an input port 58 of a detector preselector 60 which has as its center frequency $f_o$ the command center frequency.

Detection of $f_o$ at port 54 indicates the presence of a command to be passed upstream to the head end 44. The presence of such a command is detected by a detector 62, the input port 64 of which is coupled to the output port 66 of detector preselector 60. Detector preselector 60 illustratively is a Trilithic Model 6BM17/1-3-PP filter. Detector 62 illustratively is a Trilithic CD-75 detector. Detector 62 responds to the presence of command frequency $f_o$ at port 64 by closing a solid state switch 70, providing a path upstream from port 56 of tap 50 through a circuit 72 having frequency response characteristic 74 with an upper corner frequency in the range of 42 MHz to ensure the separation illustrated in FIG. 1. Circuit 72 is coupled to an input port 80 of the upstream signal path of switch 70. The output port 82 of the upstream signal path of switch 70 is coupled to the low frequency input port 84 of duplex filter 28 from which the command centered at $f_o$ is furnished back through the I/O port 26 of filter 28 and tap 20-k to the network 22. The $f_o$-centered command signal is detected by the head end 44 which takes action appropriate to the command. When no command is present at port 52 of tap 50, the signal path between ports 80 and 82 of switch 70 is open so that noise from the subscriber side of tap 20-k has no entree into the network 22. The network 22 is thus isolated from such noise except in the presence of an upstream-bound, $f_o$-centered command. When the signal path between ports 80 and 82 of switch 70 is open, port 84 is terminated through port 82 by a dummy load 88, for example, a 75Ω resistor, to ground. Switch 70 illustratively is a Mini-Circuits Model KSWHA-1-20 switch, driven, illustratively by an Allegro Series 5740 switch driver.

Similar isolators 23 can be provided between each of the remaining taps 20-1, ... 20-k-1, 20-k+1, ... 20-n and its respective station apparatus 24-1, ... 24-k-1, 24-k+1, ... 24-n in the system illustrated in FIG. 2.

In the embodiments illustrated in FIGS. 3–6, those elements which perform the same or similar functions to elements illustrated in FIG. 2 are indicated with the same reference numbers. Reference may be had to the detailed description of FIG. 2 for descriptions of the function of such elements.

Figure 3:
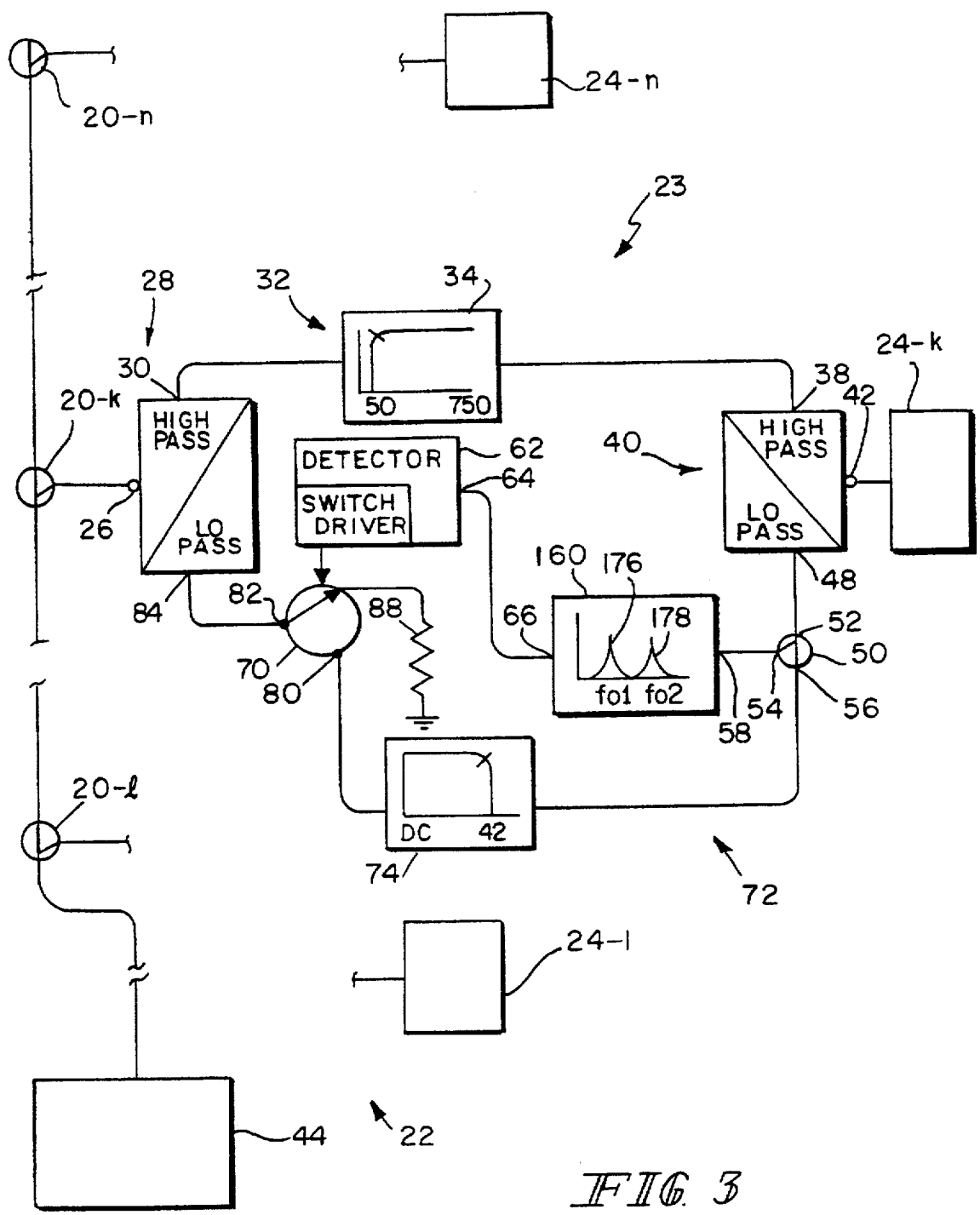

In FIG. 3, the circuit 72 having frequency response characteristic 60 is replaced by a circuit having a frequency response characteristic 160. Characteristic 160 provides two passbands 176, 178, both sharply tuned. Passband 176 is centered about a frequency $f_{o1}$, passband 178 is centered about a frequency $f_{o2}$. Thus, in this embodiment, two different commands can activate switch 70 and open the return path through circuit 72. One of these commands is $f_{o1}$ centered. The other is $f_{o2}$ centered.

Figure 4:
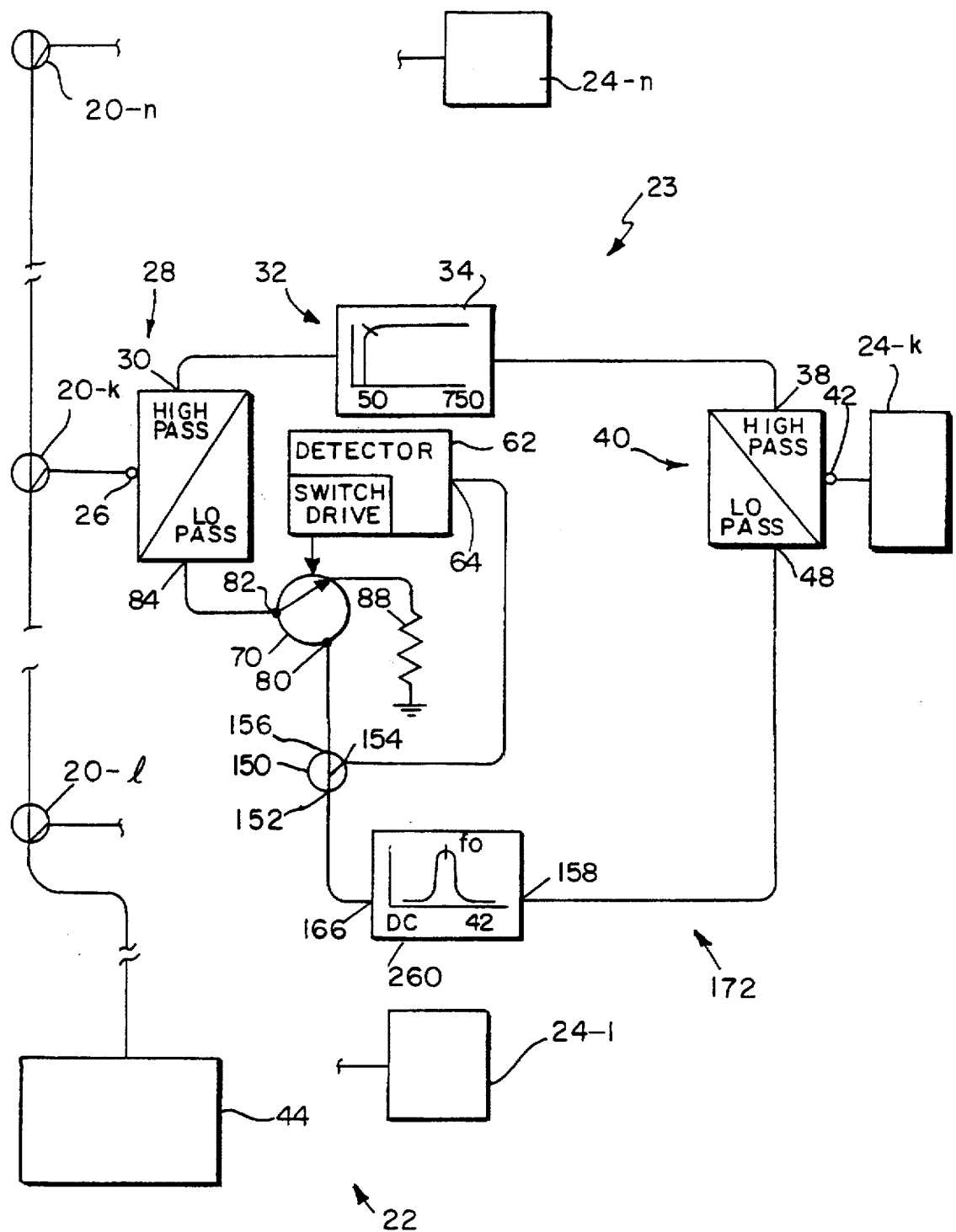

In the embodiment of the invention illustrated in FIG. 4, the return path 172 from port 48 to port 80 of switch 70 has a frequency response characteristic 260 providing a narrow passband centered about the command center frequency $f_o$. The output port 48 of diplex filter 40 is coupled to the input port 150 of circuit 172. Port 166 of circuit 172 is coupled to an input port 152 of a tap 150. A first output port 154 of tap 150 is coupled to input port 64 of detector 62. A second output port 156 of tap 150 is coupled to input port 80 of switch 70. In this embodiment, the same frequency response characteristic 260 controls both the signal coupled to the detector 62 and the signal passed upstream through switch 70 and diplex filter 28 to tap 20-k and thus to the network 22.

Figure 5:
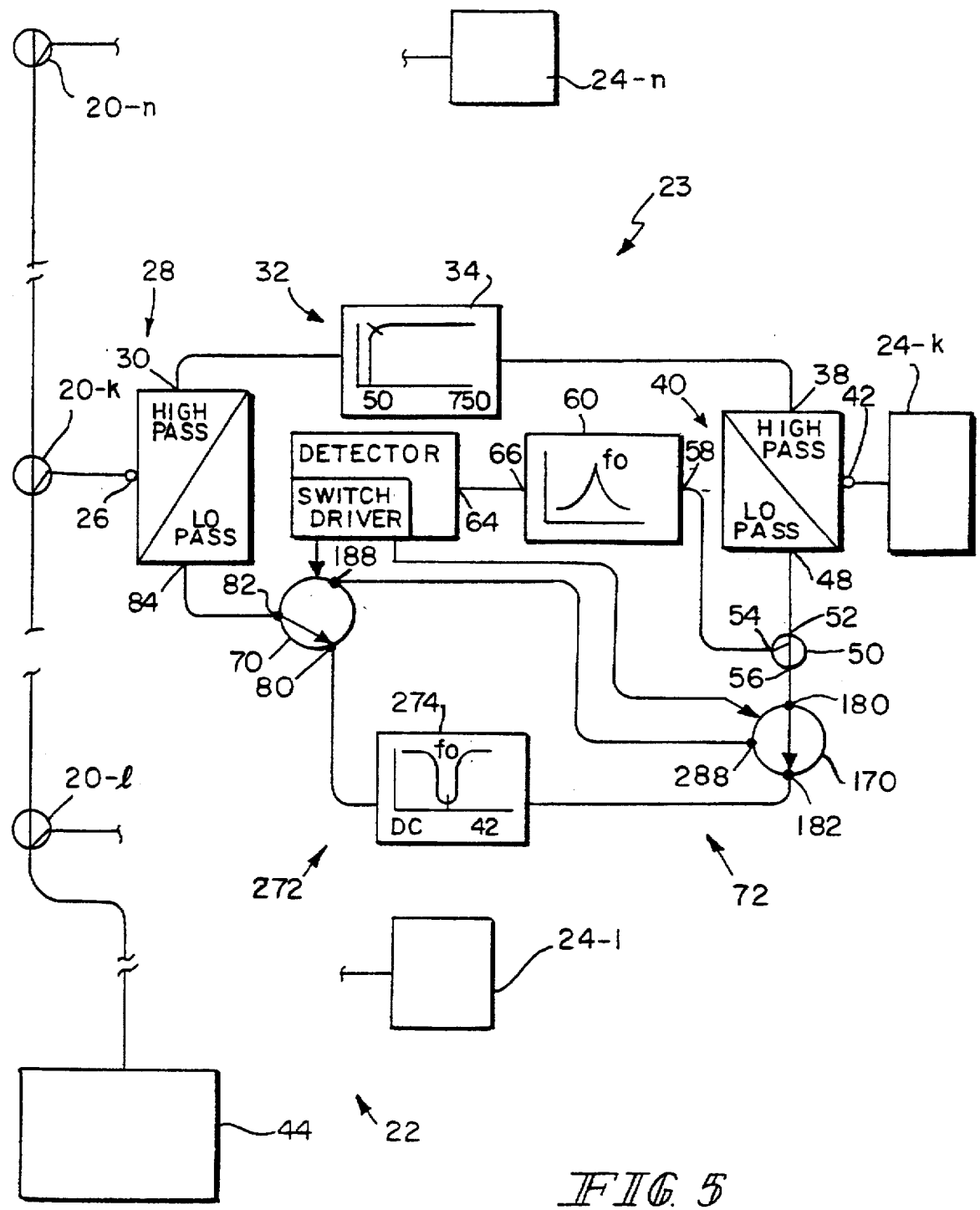

In the embodiment illustrated in FIG. 5, output port 56 of tap 50 is coupled to an input port 180 of a switch 170 which may be of the same configuration as switch 70. An output port 182 of switch 170 is coupled to a circuit 272 having a frequency response characteristic 274 characterized by a stop band or notch centered about the command center frequency $f_o$. Circuit 274 couples output port 182 of switch 170 to input port 80 of switch 70. The remaining ports 188, 288 of switches 70, 170, respectively, are coupled to each other. In this embodiment, passage of noise in the command frequency range upstream is blocked by the characteristic 274 of circuit 272. Only when the characteristic 60 permits detection 64 of the command do switches 70 and 170 change states, permitting passage of the command between their terminals 180, 82, respectively, via their terminals 288, 188, respectively. It should be noted that the characteristics 60, 274 are not merely the "inverse" of each other, since that would not be useful. Rather characteristic 60 ordinarily will be much sharper than would be the inverse of characteristic 274. That would make the embodiment of FIG. 5 useful where, for example, a considerable amount of noise existed at I/O port 42 in the stop band of characteristic 274, but the command center frequency $f_0$ was still capable of being discriminated in that noise.

Figure 6:
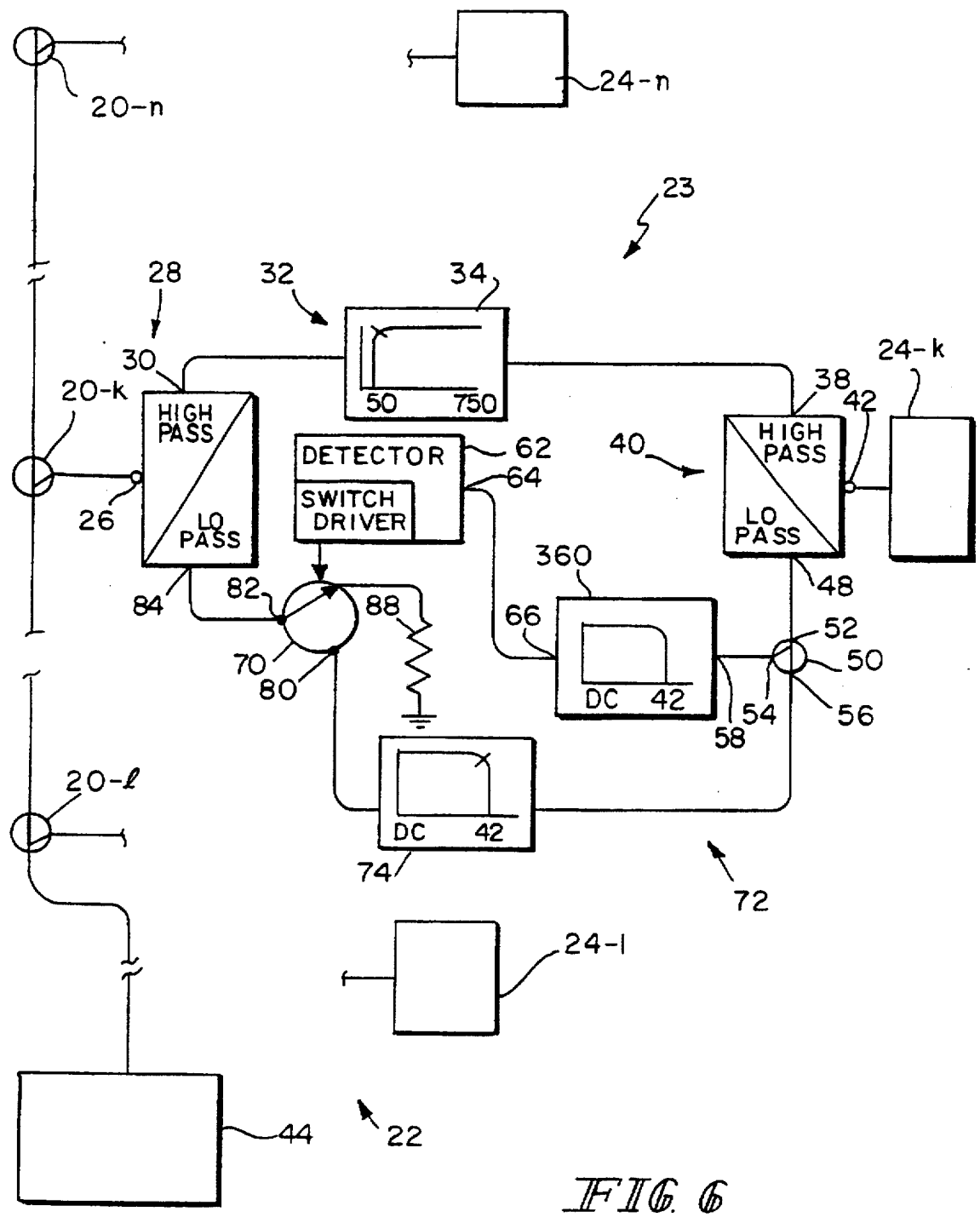

In the embodiment illustrated in FIG. 6, the detector preselector 360 has substantially frequency response characteristic 74. This embodiment would be useful where, for example, there was relatively little noise in the 0–42 MHz bandwidth at I/O port 42. This would make detection of the $f_0$ centered command quite straightforward.

Characteristics 34, 60, 74, 160, 260, 274 and 360 can be realized with filters in accordance with techniques known in the art.

Figure 7:
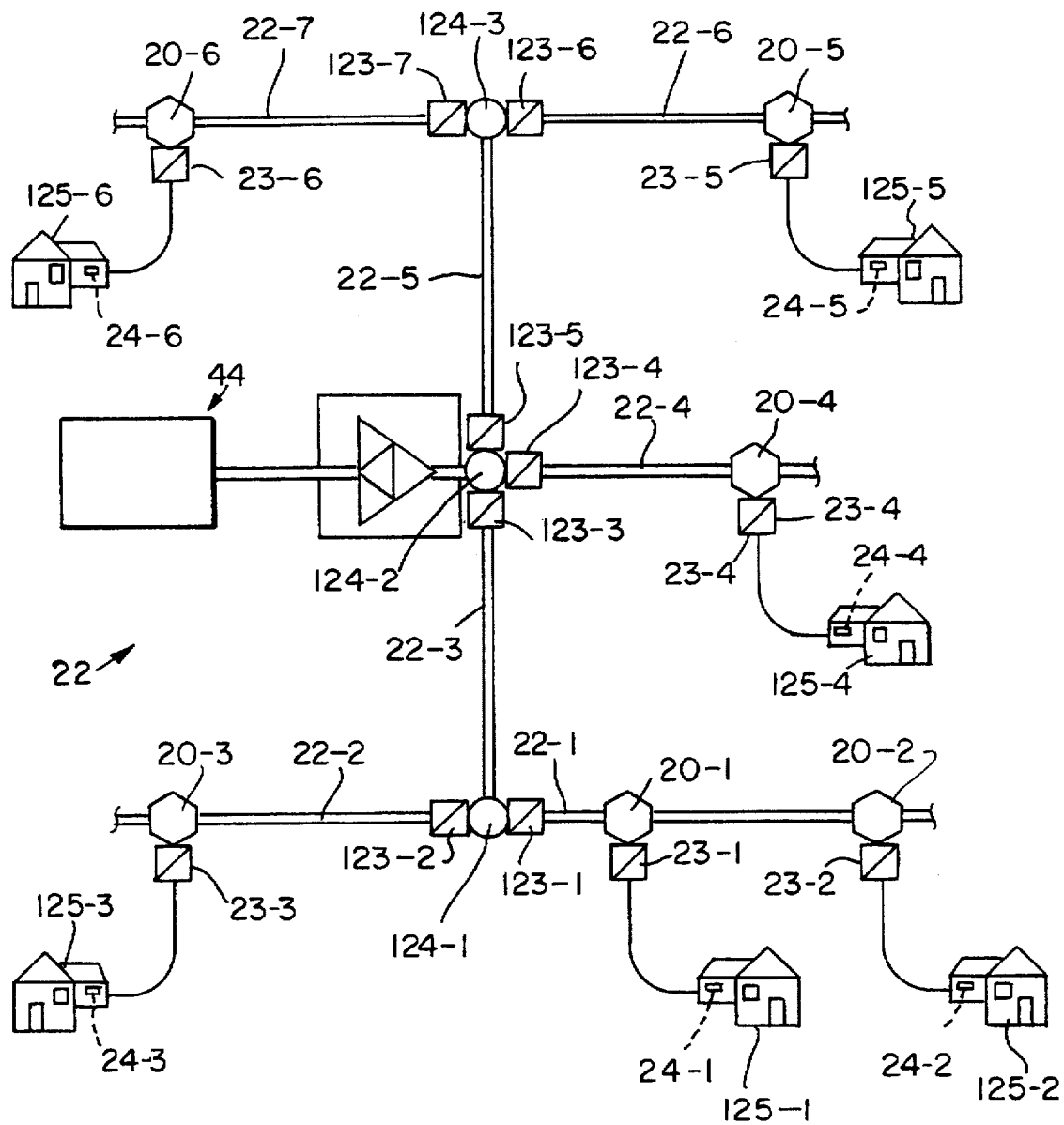

In another embodiment of the invention, illustrated in FIG. 7, additional isolators 123-1, 123-2, ... 123-l, ... 123-q, are provided at nodes 124-1, 124-2, ... 124-w, ... 124-z, where l, q, w and z are integers, $1 \leq l \leq q$, $1 \leq w \leq z$. The upstream-bound command signal paths through isolators 123-1, ... 123-l, ... 123-q are opened in the same manner as in the embodiments of FIGS. 2–6. Namely, when energy at a command frequency is detected in the upstream-bound bandwidth (about 5 MHz–42 MHz), the affected isolators 23-k, 123-l close. This establishes the pathway back to the head end 44. This is not the only technique for establishing a pathway back to the head end 44, however. By way of example, and not by way of limitation, some one or more of isolators 23-k and/or 123-l can be made to be separately addressable over the cable network 22, for example, by binary codes. A portion of a unique binary query address of each subscriber 125-1, ... 125k, ... 125n coupled to the network 22 through their respective nodes 124-1, ... 124w, ... 124-z can be used to control affected upstream isolators 123-l. This would require the isolators 23-k and/or 123-l to be "smart," that is, to be able to recognize and respond to binary codes, but an integrated and/or discrete circuit realization of such a system is well within the skill of the art. For example, subscribers 125-1 and 125-2 are both coupled to the network 22 through nodes 124-1 and 124-2. If subscribers' 125-1 and 125-2 individual station apparatus 24-1 and 24-2, respectively, are assigned digital query addresses 001001001 and 001001010, respectively, then isolators 123-1 and 123-3 can be made to respond to the addresses 001001* and 001**** (where * denotes a bit masked by the affected "smart" isolator(s) 123-l), respectively, to couple branches 22-1 and 22-3, through which subscribers 125-1 and 125-2 are coupled to the head end 44.

These simple examples illustrate the point that a hierarchy of isolators 23-k, 123-l can be used to uncouple large portions of the return path of the cable network 22 from the head end 44. This reduces the magnitude of the "antenna" to which head end 44 is coupled at any given time far beyond simply disconnecting subscribers' signal paths upstream at their isolators 23-1, 23-2 ... 23k, ... 23n. In this way, even though the quality and noise immunity of the cable network 22 upstream from the subscriber isolators 23-1, ... 23-k, ... 23-n is much greater than the noise immunity of the network 22 downstream from the subscriber isolators 23-1, ... 23-k, ... 23n, even further improvement in the noise immunity of the head end 44 to upstream-bound noise received by various branches of the network 22 can be achieved with the system illustrated in FIG. 7.

What is claimed is:

1. An information system comprising an information network and a station apparatus capable of receiving information from the network and sending a command to the network, the network capable of simultaneous transmission to the station apparatus of the information and reception from the station apparatus of the command, the command lying in a first range of frequencies and the information lying in a second non-overlapping range of frequencies, and an isolator comprising a first diplex filter having an input/output (I/O) port for signals with frequencies in both the first and second ranges, an output port for signals with frequencies in one of the first and second ranges, and an input port for signals with frequencies in the other of the first and second ranges, a second diplex filter having an I/O port for signals with frequencies in both the first and second ranges, an input port for signals with frequencies in said one of said first and second ranges, an output port for signals with frequencies in said other of said first and second ranges, a first circuit having a bandwidth including said one range for providing a first signal path between the output port of the first diplex filter and the input port of the second diplex filter, a second circuit having a bandwidth including said other range for providing a second signal path between the output port of the second diplex filter and the input port of the first diplex filter, the second signal path including a first switch having a first switch first input port, a first switch first output port, and a first switch control port, a third circuit for sensing the command, the third circuit coupled to the first switch control port for operating the first switch in response to the sensed command to connect the first switch first input port and first switch first output port to permit the command to flow in the second circuit from the second diplexer I/O port to the first diplexer I/O port.

2. The apparatus of claim 1 and further comprising a network tap for connecting the first diplexer I/O port to the network and conductors for connecting the second I/O port to the station apparatus.

3. The apparatus of claim 1 or 2 wherein the third circuit includes a third circuit filter for passing signals in a frequency range including the frequency range of the command, the third circuit filter having an input port and an output port, a detector, the detector having an input port and an output port, and a third circuit tap having an input port, a first output port and a second output port, the third circuit tap input port being coupled to the second diplexer output port, the third circuit tap first output port being coupled to the second circuit, the third circuit tap second output port being coupled to the third circuit filter input port, the third circuit filter output port being coupled to the detector input port, and the detector output port being coupled to the first switch control port.

4. The apparatus of claim 3 wherein the third circuit filter comprises a filter having a single passband centered about a characteristic frequency $f_0$.

5. The apparatus of claim 4 wherein the command is centered about $f_0$.

6. The apparatus of claim 3 wherein the third circuit filter comprises a filter having first and second passbands separated by a stopband, the first passband centered about a first characteristic frequency $f_{o1}$, and the second passband centered about a second characteristic frequency $f_{o2}$.

7. The apparatus of claim 6 wherein the command is centered about $f_{o1}$ and the station apparatus is capable of sending a second command to the network, the second command being centered about $f_{o2}$.

8. The apparatus of claim 1 or 2 wherein the third circuit includes a detector having an input port and an output port and a third circuit tap having an input port, a first output port and a second output port, the third circuit tap input port and third circuit tap first output port being coupled in the second circuit, the third circuit tap second output port being coupled to the detector input port, and the detector output port being coupled to the first switch control port.

9. The apparatus of claim 8 wherein the command and the second circuit bandwidth are centered about a characteristic frequency $f_0$.

10. The apparatus of claim 1 wherein the first switch further comprises a second input port, and further comprising a second switch having a second switch first input port, a second switch first output port, a second switch second output port, and a second switch control port, the third circuit including a third circuit filter for passing signals in a frequency range including the frequency range of the command, the third circuit filter having an input port and an output port, a detector, the detector having an input port and at least one output port, and a third circuit tap having an input port, a first output port and a second output port, the third circuit tap input port being coupled to the second diplexer output port, the third circuit tap first output port being coupled to the second switch input port, the second switch first output port being coupled to the first switch first input port, the third circuit tap second output port being coupled to the third circuit filter input port, the third circuit filter output port being coupled to the detector input port, and the detector output port being coupled to the first and second switch control ports.

11. The apparatus of claim 10 wherein the third circuit filter comprises a filter having a single passband centered about a characteristic frequency $f_0$.

12. The apparatus of claim 11 wherein the command is centered about $f_0$.

13. The apparatus of claim 10, 11 or 12 and further comprising a fourth circuit having a stopband including the command center frequency, the fourth circuit coupled between the second switch second output port and the first switch second input port.

14. The apparatus of claim 3 wherein the third circuit filter has substantially the same passband as the second circuit.

15. The apparatus of claim 1, 2, 10, 11 or 12 wherein said first range includes substantially the 5 MHz–42 MHz band and said second range includes substantially the 50 MHz–750 MHz band.

16. An isolator comprising a first diplex filter having an input/output (I/O) port for signals with frequencies in first and second non-overlapping ranges, an output port for signals with frequencies in one of the first and second ranges, and an input port for signals with frequencies in the other of the first and second ranges, a second diplex filter having an I/O port for signals with frequencies in both the first and second ranges, an input port for signals with frequencies in said one of said first and second ranges, an output port for signals with frequencies in said other of said first and second ranges, a first circuit having a bandwidth including said one range for providing a first signal path between the output port of the first diplex filter and the input port of the second diplex filter, a second circuit having a bandwidth including said other range for providing a second signal path between the output port of the second diplex filter and the input port of the first diplex filter, the second signal path including a first switch having a first switch first input port, a first switch first output port, and a first switch control port, and a third circuit for sensing a first signal in said other of said first and second ranges, the third circuit coupled to the first switch control port for operating the first switch in response to the sensed signal to connect the first switch first input port and first switch first output port.

17. The apparatus of claim 16 wherein the third circuit includes a third circuit filter for passing signals in said other of said first and second frequency ranges, the third circuit filter having an input port and an output port, a detector, the detector having an input port and an output port, and a tap having an input port, a first output port and a second output port, the tap first input port being coupled to the second diplexer output port, the tap first output port being coupled to the second circuit, the tap second output port being coupled to the third circuit filter input port, the third circuit filter output port being coupled to the detector input port, and the detector output port being coupled to the first switch control port.

18. The apparatus of claim 17 wherein the third circuit filter comprises a filter having a single passband centered about a characteristic frequency $f_O$.

19. The apparatus of claim 17 wherein the third circuit filter comprises a filter having first and second passbands separated by a stopband, the first passband centered about a first characteristic frequency $f_{O1}$, and the second passband centered about a second characteristic frequency $f_{O2}$.

20. The apparatus of claim 16 or 17 wherein the third circuit includes a detector having an input port and an output port and a third circuit tap having an input port, a first output port and a second output port, the third circuit tap input port and third circuit tap first output port being coupled in the second circuit, the third circuit tap second output port being coupled to the detector input port, and the detector output port being coupled to the first switch control port.

21. The apparatus of claim 20 wherein the second circuit bandwidth is centered about a characteristic frequency $f_O$.

22. The apparatus of claim 16 wherein the first switch further comprises a second input port, and further comprising a second switch having a second switch first input port, a second switch first output port, a second switch second output port, and a second switch control port, the third circuit including a third circuit filter for passing signals in said other of said first and second frequency ranges, the third circuit filter having an input port and an output port, a detector, the detector having an input port and at least one output port, and a third circuit tap having an input port, a first output port and a second output port, the third circuit tap input port being coupled to the second diplexer output port, the third circuit tap first output port being coupled to the second switch input port, the second switch first output port being coupled to the first switch first input port, the third circuit tap second output port being coupled to the third circuit filter input port, the third circuit filter output port being coupled to the detector input port, and the detector output port or ports being coupled to the first and second switch control ports.

23. The apparatus of claim 22 wherein the third circuit filter comprises a filter having a single passband centered about a characteristic frequency $f_O$.

24. The apparatus of claim 23 and further comprising a fourth circuit having a stopband including the frequency $f_O$, the fourth circuit coupled between the second switch second output port and the first switch second input port.

25. The apparatus of claim 17 wherein the third circuit filter has substantially the same passband as the second circuit.

26. The apparatus of claim 16, 17, 18, 19, 22, 23, 24 or 25 wherein said first range includes substantially the 5 MHz–42 MHz band and said second range includes substantially the 50 MHz–750 MHz band.

* * * * *